| (12) | United States Patent<br>Shallal et al. | | (10) Patent No.: US 11,042,492 B2<br>(45) Date of Patent: Jun. 22, 2021 |
|---|---|---|---|

(54) MEMORY MODULE WITH PROGRAMMABLE COMMAND BUFFER

(71) Applicant: Rambus Inc., Sunnyvale, CA (US)

(72) Inventors: Aws Shallal, Cary, NC (US); Larry Grant Giddens, Raleigh, NC (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 16/631,163

(22) PCT Filed: Oct. 17, 2018

(86) PCT No.: PCT/US2018/056351
§ 371 (c)(1),
(2) Date: Jan. 14, 2020

(87) PCT Pub. No.: WO2019/083792
PCT Pub. Date: May 2, 2019

(65) Prior Publication Data
US 2020/0226079 A1    Jul. 16, 2020

Related U.S. Application Data

(60) Provisional application No. 62/576,415, filed on Oct. 24, 2017, provisional application No. 62/607,905, filed on Dec. 19, 2017.

(51) Int. Cl.
*G06F 13/16*    (2006.01)
*G06F 13/42*    (2006.01)

(52) U.S. Cl.
CPC ...... *G06F 13/1668* (2013.01); *G06F 13/4282* (2013.01); *G06F 2213/0016* (2013.01)

(58) Field of Classification Search
CPC ............ G06F 13/1668; G06F 13/4282; G06F 2213/0016
See application file for complete search history.

(56) References Cited

U.S. PATENT DOCUMENTS 5,935,263 A     8/1999  Keeth et al.
5,996,043 A  *  11/1999 Manning .............. G11C 7/1072
                                                      711/105
6,925,534 B2    8/2005  David
(Continued)

OTHER PUBLICATIONS

PCT International Search Report and Written Opinion, PCT/US2018/056351, dated Jan. 8, 2019, 15 Pages.
(Continued)

*Primary Examiner* — Henry Tsai
*Assistant Examiner* — John B Roche
(74) *Attorney, Agent, or Firm* — Fenwick & West LLP (57) ABSTRACT

A memory module includes a plurality of memory integrated circuit (IC) packages to store data and a command buffer IC to buffer one or more memory commands destined for the memory IC packages. The command buffer IC includes a first interface circuit and one or more second interface circuits. The first interface circuit receives the one or more memory commands. The one or more second interface circuits output a pre-programmed command sequence to one or more devices separate from the command buffer IC, the pre-programmed command sequence output in response to the one or more memory commands matching a pre-programmed reference command pattern.

18 Claims, 6 Drawing Sheets

(56) References Cited

U.S. PATENT DOCUMENTS

| | | |
|---|---|---|
| 6,931,505 B2 | 8/2005 | David |
| 7,024,511 B2 | 4/2006 | Ruehle |
| 7,251,711 B2 | 7/2007 | Roohparvar |
| 7,339,840 B2 | 3/2008 | Wallner et al. |
| 7,383,416 B2 | 6/2008 | Oeschay et al. |
| 7,389,387 B2 | 6/2008 | David |
| 7,606,993 B2 | 10/2009 | Oyaizu et al. |
| 7,827,323 B2 | 11/2010 | Bar-Shalom et al. |
| 8,001,285 B1 | 8/2011 | Bar-Shalom |
| 8,301,827 B2 | 10/2012 | Yeh |
| 8,966,327 B1 | 2/2015 | Wang |
| 9,424,206 B2 | 8/2016 | Tseng et al. |
| 9,507,658 B2 | 11/2016 | Ko et al. |
| 2011/0145470 A1 | 6/2011 | Arai et al. |
| 2011/0283165 A1* | 11/2011 | Nishiyama .......... G06F 11/1068 714/773 |
| 2013/0151755 A1* | 6/2013 | Elhamias ............ G06F 3/0634 711/103 |
| 2015/0081955 A1* | 3/2015 | Vucinic ............... G06F 13/4282 711/103 |

OTHER PUBLICATIONS

Byte Addressable Energy Backed Interface, JEDED Standard, Dec. 2015, 1-102, Standard No. 245. 110 pages.
DDR4 NVDIMM-N Design Specification, JEDED Standard, Oct. 2016, 4.20.29-1 4.20.29-40, Standard No. 21C. 40 pages.

* cited by examiner

MEMORY MODULE WITH PROGRAMMABLE COMMAND BUFFER

BACKGROUND

Memory systems can store data in memory modules, such as dual in line memory modules (DIMMs). However, memory modules are typically limited in their ability to support new or additional features.

BRIEF DESCRIPTION OF THE DRAWINGS

The teachings of the embodiments herein can be readily understood by considering the following detailed description in conjunction with the accompanying drawings.

DETAILED DESCRIPTION OF EMBODIMENTS

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

In at least one embodiment of the present disclosure, a memory module is disclosed. The memory module comprises a plurality of memory integrated circuit (IC) packages to store data. The memory module also comprises a command buffer IC to buffer one or more memory commands destined for the memory IC packages. The command buffer IC includes a first interface circuit to receive the one or more memory commands and one or more second interface circuits to output a pre-programmed command sequence to one or more devices separate from the command buffer IC. The pre-programmed command sequence is output in response to the one or more memory commands matching a pre-programmed reference command pattern.

Figure 1:
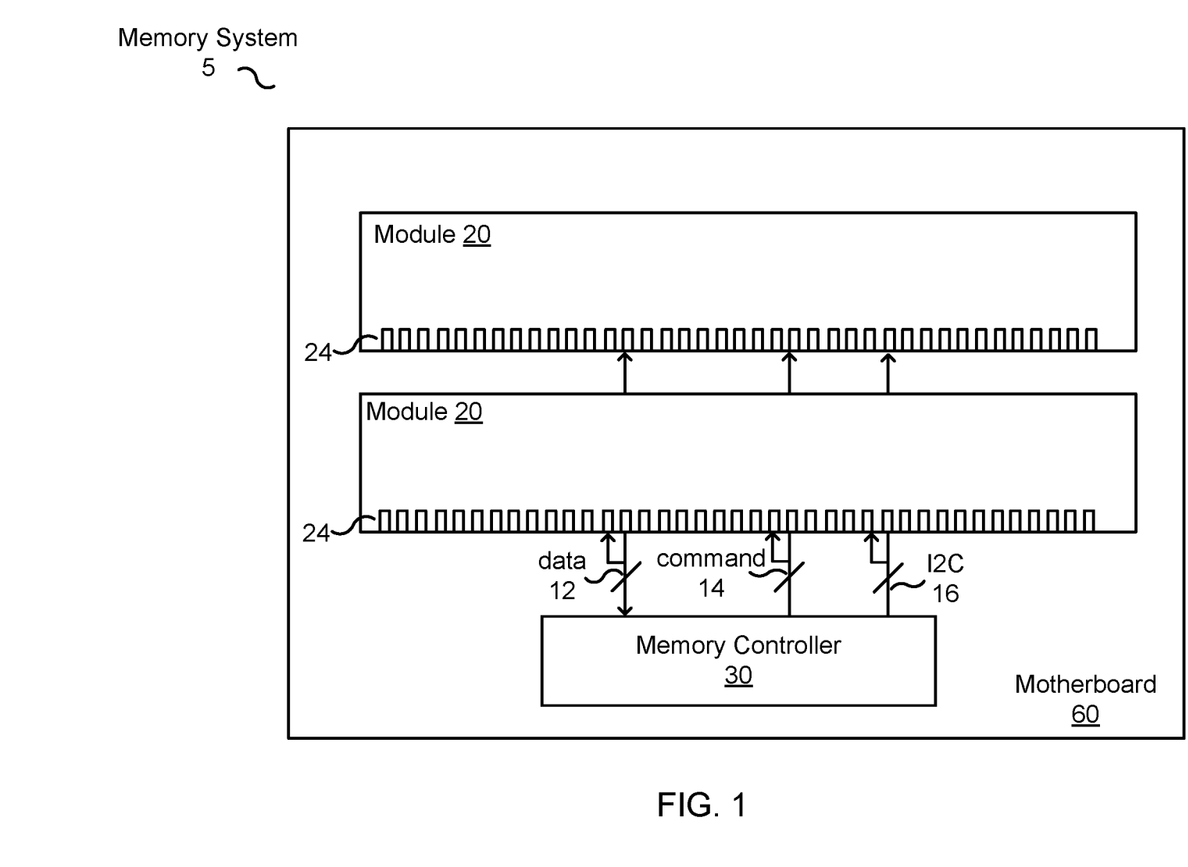
FIG. 1 is an illustration of a memory system, according to at least one embodiment.

FIG. 1 is schematic illustration of a memory system 5, according to one embodiment. In one embodiment, the memory system 5 represents a computing device such as a server. The memory system 5 includes a motherboard 60. Two memory modules 20 and a memory controller 30 are connected to the motherboard 60. The memory modules 20 may be inserted into memory module sockets of the motherboard 60, and the memory controller 30 may be soldered to the motherboard 60 or connected to a socket of the motherboard 60. In at least one embodiment described herein, each memory module 20 includes a programmable command buffer integrated circuit (IC) (not shown). The programmable command buffer IC may allow the memory module 20 to support new memory features, non-standardized memory features, proprietary memory features, or other memory features.

The memory controller 30 and the memory modules 20 are interconnected via a data channel 12, a command channel 14, and an inter-integrated circuit (I2C) channel 16. The data channel 12 includes multiple signal lines for carrying data signals (DQ) and data strobe (DQS) signals in parallel between the memory controller 30 and the memory modules 20. The memory controller 30 can read data from and write data to the memory modules 20 via the data channel 12. In one embodiment, the data channel 12 carries 72 DQ signals and 8 DQS signals. The memory controller 30 can send memory commands for memory operations to the memory modules 20 via the command channel 14. The command channel 14 includes multiple signal lines for carrying memory commands using signals such as row address strobe (RAS), column address strobe (CAS), write enable (WE), address (ADDR), chip select (CS), and other control signals.

In one embodiment, the memory controller 20 is an integrated circuit (IC) chip that controls the operation of the memory system 10. Examples of a memory controller 20 include a central processing unit (CPU), a graphics processing unit (GPU), a system on chip (SoC), etc.

Each memory module 20 can include an edge connector 24 located at the edge of the PCB. The edge connector 24 can include multiple conductive pins that form electrical and physical connections with a socket of the motherboard 60. In one embodiment, the memory module 20 can be a dual in line memory module (DIMM).

Figure 2:
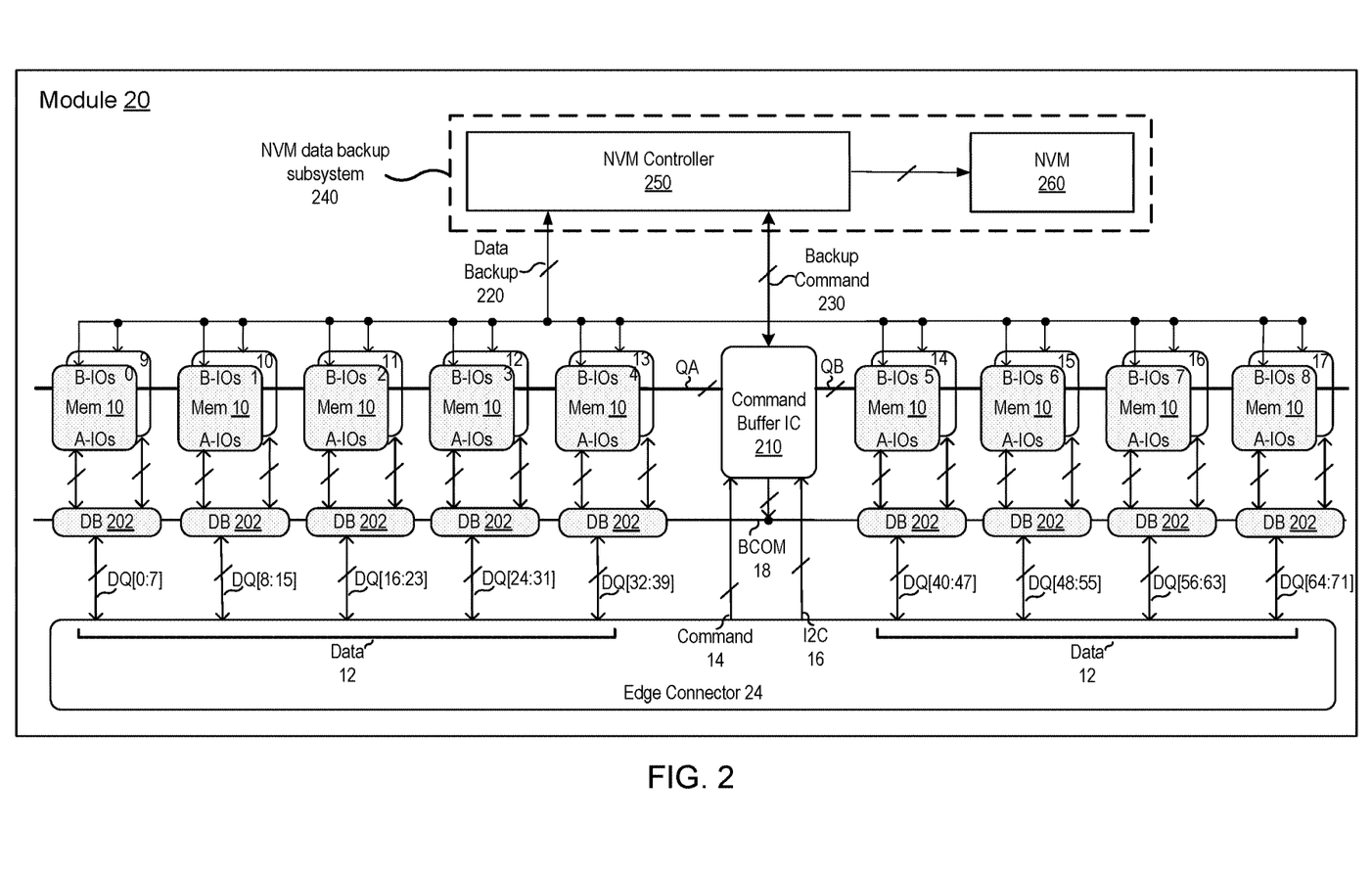
FIG. 2 is a more detailed view of a memory module from FIG. 1, according to at least one embodiment.

FIG. 2 is a more detailed view of a memory module 20 from FIG. 1, according to an embodiment. The memory module 20 in FIG. 2 can represent any of the memory modules 20 from FIG. 1. As previously described, the memory module 20 includes an edge connector 24. In addition, the memory module 20 includes memory IC packages 10, data buffer ICs 202, a command buffer IC 210, and a non-volatile memory (NVM) data backup subsystem 240. Each memory module 20 includes several memory IC packages 10. Each memory IC package 10 can include one or more ICs that include dynamic random access memory (DRAM) and store data in DRAM memory cells. DRAM memory cells are volatile and lose their data when power is removed from the memory IC packages 10. The memory IC packages 10 can include a single DRAM die or multiple dies of DRAM, for example in a stacked configuration.

The memory module 20 includes eighteen memory IC packages 10 organized into a single 72 bit wide rank of memory controlled by a single chip select signal. Each memory IC package 10 includes a primary x4 data port A-IO and a backup x4 data port B-IO. The primary data ports A-IO are used for transferring data with the memory controller 30 (via the data buffer ICs 202, edge connector 24, and primary data channel 12) during normal memory access operations, such as read and write operations. The backup data ports B-IO are used for transferring data in the event of a power loss, or to restore data that was backed up during a power loss.

In another embodiment the memory module 20 can include more or less than eighteen memory IC packages 10. In another embodiment, memory IC packages 10 can be organized into more than one memory rank. For example, other embodiments can include two or four ranks of memory IC packages 10 where each rank is controlled by its own chip select signal. As another example, the memory IC packages 10 can be multi-rank memory IC packages that receive multiple chip select signals.

The data buffer ICs 202 are coupled between the memory IC packages 10 and the edge connector 24. The data buffer ICs 202 buffer data that is being transferred between the memory IC packages 10 and the memory controller 30 via the primary data channel 12 and edge connector 24. The data buffer ICs 202 reduce the loading on the primary data channel 12 so that additional memory ranks can be included in the memory module 20 without increasing the loading on the primary data channel 12. Each data buffer IC 202 can buffer 8 data DQ signals and one data strobe signal DQS (DQS is not shown in FIG. 2). During write operations initiated by the memory controller 30, the data buffer ICs 202 receive data signals from the memory controller 30 (via the primary data channel 12 and edge connector 24), buffer the data signals, and provide the data signals to the memory IC packages 10. During read operations initiated by the memory controller 30, the data buffer ICs 202 receive data signals from the memory IC packages 10, buffer the data signals, and provide the data signals to the memory controller 30 (via the data channel 12 and edge connector 24). In some embodiments, the memory module 20 does not have any data buffer ICs 202 and the primary data ports A-IO are connected directly to the edge connector 24 with signal traces.

The module 20 also includes a NVM data backup subsystem 240. In the event of a power loss or during periods of inactivity, data in the memory IC packages 10 is backed up by offloading data from the packages 10 to the NVM data backup subsystem 240 and storing the data in the NVM data backup subsystem 240. The backed up data can later be restored by transferring the backed up data from the NVM data backup subsystem 240 to the memory IC packages 10. In a specific embodiment, the NVM data backup subsystem 240 includes a NVM controller 250 (which can be an IC) and a NVM 260. NVM 260 includes re-writable non-volatile memory cells that store data in a non-volatile manner, and which retain data even when a power supply voltage of the NVM 260 is not present. For example, the non-volatile memory cells can be NAND or NOR based memory cells. In the event of a power loss, the NVM controller 250 transmits memory read commands to the command buffer IC 210 via the backup command channel 230, which are then provided to the memory IC packages 10. The read commands cause the memory IC packages 10 to output their data onto the data backup channel 220. The NVM controller 250 receives the data via the data backup channel 220 and writes the data to the NVM 260. When power is restored, the NVM controller 250 reads the backed up data from the NVM 260 and transfers the backed up data to the memory IC packages 10. The NVM controller 250 can be a single integrated circuit or a combination or several integrated circuits.

In the embodiment of FIG. 2, the NVM data backup subsystem 240 is included in the memory module 20. In alternate embodiments, the NVM data backup subsystem 240 serves as centralized NVM storage that is shared amongst several different memory modules 20. All of or a portion of the NVM data backup subsystem 240 may be separate from and external to the memory modules 20. The NVM data backup subsystem 240 can also include a super-capacitor or battery (not shown) that provides a source of power to the NVM data backup subsystem 240 and memory modules 20 for a short amount of time, even when there is loss of power to the rest of the memory system 5.

The command buffer IC 210 is coupled to the edge connector 24, data buffer ICs 202, memory IC packages 10, and NVM controller 250. In one embodiment, the command buffer IC 210 may be a register clock driver (RCD). The command buffer IC can have several functions, and is also programmable as explained below.

The command buffer IC 210 typically receives memory commands destined for the memory IC packages 10 from the memory controller 30 via the primary command channel 14 and edge connector 24. The command buffer IC 210 buffers and then transmits those memory commands to the memory IC packages 10 through the secondary command channels QA and QB. The secondary command channels QA and QB communicatively couples the command buffer IC 210 to the memory IC packages 10. The command buffer IC 210 can control the operation of the data buffer ICs 202 by transmitting data buffer commands to the data buffer ICs 202 through the buffer command BCOM channel 18. The buffer command channel 18 communicatively couples the command buffer IC 210 to the data buffer ICs 202.

The command buffer IC 210 can transmit commands to and/or receive commands from the NVM controller 250 via the backup command channel 230. Commands destined for the memory IC packages 10 may also be received via the backup command channel 18, buffered by the command buffer IC 210, and then transmitted to the memory IC packages 10 via the secondary command channels QA and QB. In one embodiment, the backup command channel 230 can be a LCOM channel.

The command buffer IC 210 can also store one or more pre-programmed reference command patterns and one or more pre-programmed outgoing command sequences associated with the pre-programmed reference command patterns. Incoming commands received by the command buffer IC 210 (e.g. via the primary command channel 14 or backup command channel 230) can be compared to the pre-programmed reference command patterns. If the incoming commands match a pre-programmed reference command pattern, the command buffer IC 210 outputs an associated sequence of pre-programmed outgoing commands. The outgoing commands may be output to the memory IC packages 10 via the secondary command channels QA/QB, to the data buffer ICs 202 via the buffer command channel 18, and/or to the NVM controller 250 via the backup command channel 230. The memory IC packages 10, data buffer ICs 202 and NVM controller 250 are devices which are separate from and external to the command buffer IC.

The command buffer IC can thus trigger pre-programmed outgoing commands upon the detection of an incoming pre-programmed command pattern. The programmable nature of the command buffer IC 210 allows the memory module 20 to be support features that can be proprietary or customized for specific applications. For example, a specific sequence of incoming commands received via the primary command channel 14 may trigger a backup of data from the memory IC packages 14 to the NVM data backup subsystem 240.

Figure 3:
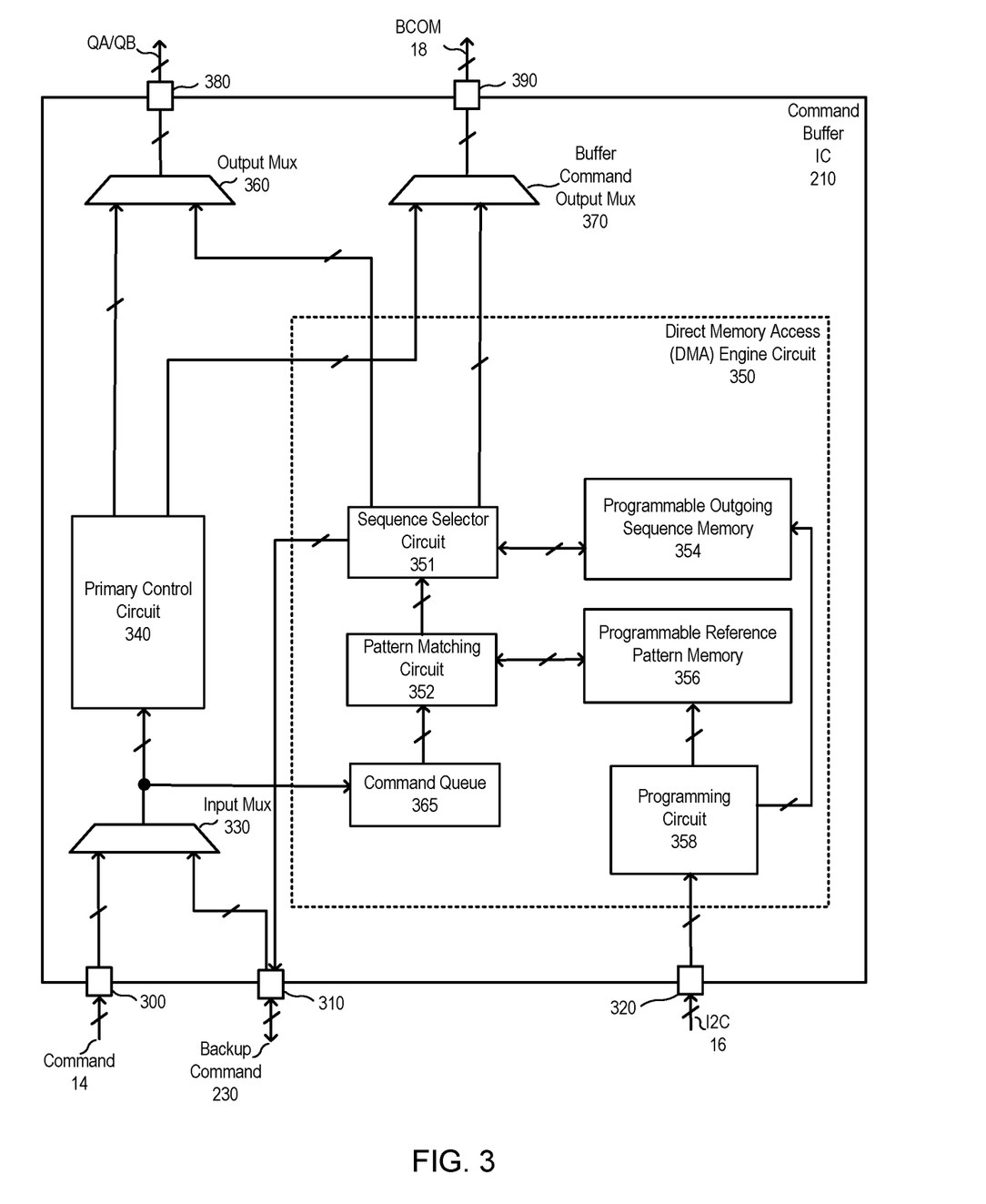
FIG. 3 is more detailed view of a command buffer IC from FIG. 2, according to at least one embodiment.

FIG. 3 is more detailed view of the command buffer IC from FIG. 2, according to an embodiment. The command buffer IC 210 includes a primary command channel interface circuit 300, an input mux 330, a primary control circuit 340, a direct memory access (DMA) engine circuit 350, an output mux 360, a buffer command output mux 370, a primary command channel interface circuit 300, a backup command channel interface circuit 310, an I2C channel interface circuit 320, a secondary command channel interface circuit 380, and a buffer command channel interface circuit 390. Each interface circuit can be a combination of transmitter and/or receiver circuits.

The primary command channel interface circuit 300 is coupled to the primary command channel 14. The backup command channel interface circuit 310 is coupled to the backup command channel 230. The I2C interface circuit 320 is coupled to the I2C channel 16. The secondary command channel interface circuit 380 is coupled to the secondary command channel QA/QB. The buffer command channel interface circuit 390 is coupled to the buffer command channel 18.

The primary command channel interface circuit 300 can receive a sequence of one or more memory commands from the memory controller 30 via the primary command channel 14. The backup command channel interface circuit 310 can also receive a sequence of one or more memory commands from the NVM controller 250 via the backup command channel 230. The input mux 330 has an input coupled to the primary command channel interface circuit 300 and another input coupled to the backup command channel interface circuit 210. The input mux 330 selects commands from one of these two interface circuits 300 and 310, and provides the selected commands to the primary control circuit 340.

The primary control circuit 340 receives commands from the input mux 330, buffers the commands, and then outputs the commands to the output mux 360. The primary control circuit 340 may also decode the commands and determine if the operation of the data buffer ICs 202 need to be adjusted to support a memory operation specified by the commands. If so, it outputs one or more buffer commands to the buffer command output mux 370.

The DMA engine circuit 350 allows the command buffer IC 210 to quickly send pre-programmed commands to devices external to the command buffer IC when a specific incoming command sequence from a memory controller is detected. The pre-programmed commands can be sent, for example, to the memory IC packages 10, data buffers ICs 202, and/or NVM controller 250. As shown, the DMA engine circuit 350 includes a sequence selector circuit 351, pattern matching circuit 352, a command queue 365, a programmable outgoing sequence memory 354, a programmable reference pattern memory 356, and a memory programming circuit 358.

The programmable reference pattern memory 356 stores one or more pre-programmed reference command patterns. The programmable outgoing sequence memory 354 stores one or more pre-programmed outgoing command sequences associated with the pre-programmed reference command patterns. The memories 354 and 356 can be any type of memory structures capable of storing information in a programmable manner, and may include but are not limited to registers, buffers and multi-time programmable memories.

The command queue 365 holds a sequence of one or more incoming commands. The pattern matching circuit 352 determines whether the one or more memory commands from the command queue 365 match any pre-programmed reference command pattern from the programmable reference pattern memory 356. Responsive to the one or more memory commands matching a pre-programmed reference command pattern, the sequence selector circuit 351 selects a pre-programmed outgoing command sequence associated with the matching pre-programmed reference command pattern. The pre-programmed outgoing command sequence is selected from the pre-programmed outgoing command sequences stored in the programmable outgoing sequence memory 354.

The selected pre-programmed outgoing command sequence is output by the sequence selector circuit 351. The selected command sequence may include a mix of commands destined for memory IC packages 10, commands destined for the NVM controller 250, and commands destined for the data buffer ICs 202. Commands for the memory IC packages 10 are provided to the output MUX 360. Commands for the data buffer ICs 202 are provided to the buffer command output mux 370. Commands for the NVM controller 250 are provided to the backup command interface circuit 310.

The output mux 360 has a first input coupled to the primary control circuit 340 and another input coupled to the sequence selector circuit 351. The output mux 360 selects commands from one of its two inputs and provides the selected commands to the secondary command channel interface circuit 380, which then transmits the selected commands across the secondary command channel QA/QB. Typically the output mux 360 selects the commands from the primary control circuit 340. However, the output mux 360 may select commands from the sequence selector circuit 351 if a pre-programmed reference pattern is detected.

The buffer command output mux 370 has a first input coupled to the primary control circuit 340 and another input coupled to the sequence selector circuit 351. The buffer command output mux 370 selects commands from one of its two inputs and provides the selected commands to the buffer command channel interface circuit 390. The buffer command channel interface circuit 390 then transmits the selected commands across the buffer command channel 390. Typically the buffer command output mux 370 selects commands from the primary control circuit 340. However, the buffer command output mux 370 may select commands from the sequence selector circuit 351 if a pre-programmed reference pattern is detected.

The backup command channel interface circuit 310 can receive outgoing commands from the sequence selector circuit 351. The backup command channel interface circuit 310 transmits these commands across the backup command channel 230.

To program the memories 354 and 356, the memory controller 30 sends programming information describing the reference command patterns and their associated outgoing command sequences via the I2C channel 16 to the command buffer IC 210. The I2C interface circuit 320 receives the programming information, and the programming circuit 358 uses the programming information to program the programmable reference pattern memory 356 to include the pre-programmed reference command patterns and programs the programmable outgoing sequence memory 354 to include the pre-programmed outgoing command sequences.

In some embodiments, the memory controller 30 includes a programming control circuit (not shown) which generates the programming information, and an interface circuit (not shown) which transmits the programming information to the command buffer IC 210. The programming information transmitted by the memory controller 30 can be in the form of a special program command along with one or more reference command patterns and their associated outgoing command sequences. In some embodiments, the memory controller 30 can transmit the programming information for programming the memories 354 and 356 through another communication channel other than the I2C channel 16, such as through the primary command channel 14. The programming information is then received at the primary command channel interface circuit 300 of the command buffer IC 210. In some embodiments, the programming can be controlled by a BIOS or a software application installed on a computing device and the programming can occur when the system is first powered on.

Figure 4:
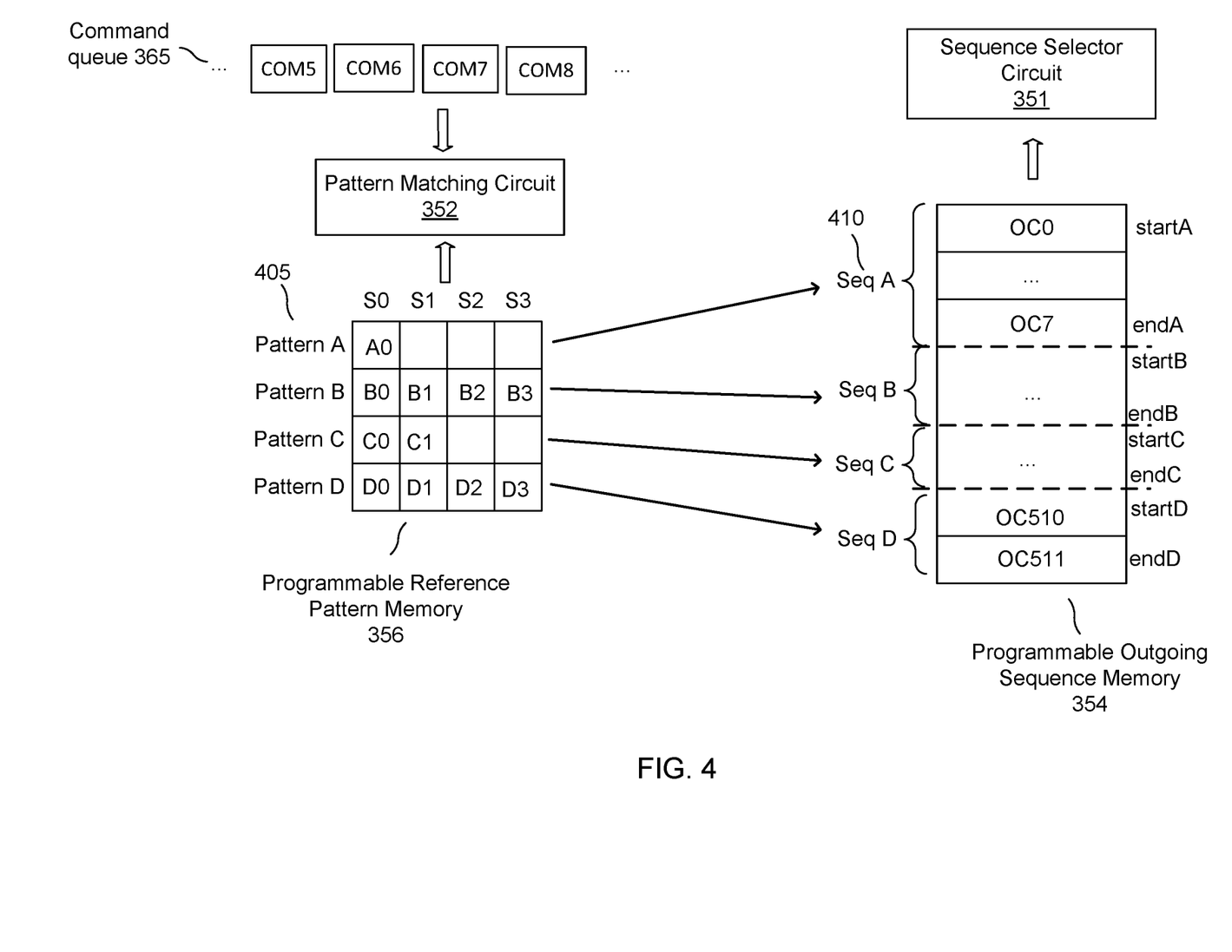
FIG. 4 illustrates the detailed operation of components of the DMA engine circuit from FIG. 3, according to at least one embodiment.

FIG. 4 illustrates the detailed operation of components of the DMA engine circuit 350 from FIG. 3, according to an embodiment. The command queue 365 snoops incoming commands and temporarily stores a sequence of the incoming commands. The commands are stored in the order in which the commands are received. As shown in FIG. 4, the command queue 365 is four commands deep, and currently stores a sequence of commands COM5, COM6, COM7, and COMB. The command queue 365 may be a shift register where new commands cause the oldest commands to be removed from the shift register.

The programmable reference pattern memory 356 is structured as a two-dimensional array (e.g. a matrix) with four rows and four columns. Each row of the array stores data for a pre-programmed reference command pattern 405 (e.g. pattern A, B, C, D). Each column of the array represents a particular command in the pattern 405 and its sequential position in the pattern (e.g. S0, S1, S2, S3). Each reference command pattern 405 can be between 1 to 4 commands long. Reference command pattern A includes a single command AO. Reference command pattern B includes a sequence of four commands B0, B1, B2 and B3. Reference command pattern C includes a sequence of two commands C0 and C1. Reference command pattern D includes a sequence of four commands D0, D1, D2 and D3. In other embodiments, a reference command pattern can have more than four commands.

The programmable outgoing sequence memory 354 stores data for several pre-programmed outgoing command sequences 410 (e.g. Seq A-D). Each outgoing command sequence 410 is associated with and triggered by a corresponding reference command pattern 405. For example, pattern A is associated with sequence A, pattern B is associated with sequence B, pattern C is associated with sequence C, and pattern D is associated with sequence D.

In FIG. 4, the programmable outgoing sequence memory 354 is 512 entries long. Each entry holds a single outgoing command (e.g. OC1-OC511). Each pre-programmed outgoing command sequence 410 occupies a subset of the entries. Each sequence 410 has a specific start and end address in the memory 354. The start address is the location in the memory 354 where the pre-programmed outgoing command sequence 410 begins. The end address is the location in the memory 354 where the pre-programmed outgoing command sequence 410 ends. Each pre-programmed outgoing command sequence 410 can include one or more commands. For example, sequence A includes at least commands OC0 through OC7. Sequence D includes at least commands OC510 and OC511.

The commands in the programmable outgoing sequence memory 354 may include intermixed commands for memory IC packages 10, data buffer ICs 202, and NVM controller 250. The commands and the start and end addresses may be both be programmable in response to programming information received from the memory controller 30. Examples of commands that may be stored in the command queue 365, programmable reference pattern memory 356 and programmable outgoing sequence memory 354 may include, but are not limited to, the following memory commands: read, write, bank activate, self-refresh, refresh, no operation, precharge and power down.

The pattern matching circuit 352 compares the set of commands in the command queue 365 to each of the reference command patterns 405. If there is a match with a particular reference command pattern 405, the pattern matching circuit 352 provides information about the matching reference command pattern 405 to the sequence selector circuit 351. The provided information can include the start and end addresses of the outgoing command sequence 410 associated with the matching reference command pattern 405. The sequence selector circuit 351 then retrieves the sequence of outgoing commands located between the start and end address. For example, if reference command pattern A is matched, the start and end address for outgoing command sequence A is used to retrieve the commands for outgoing command sequence A.

Figure 5:
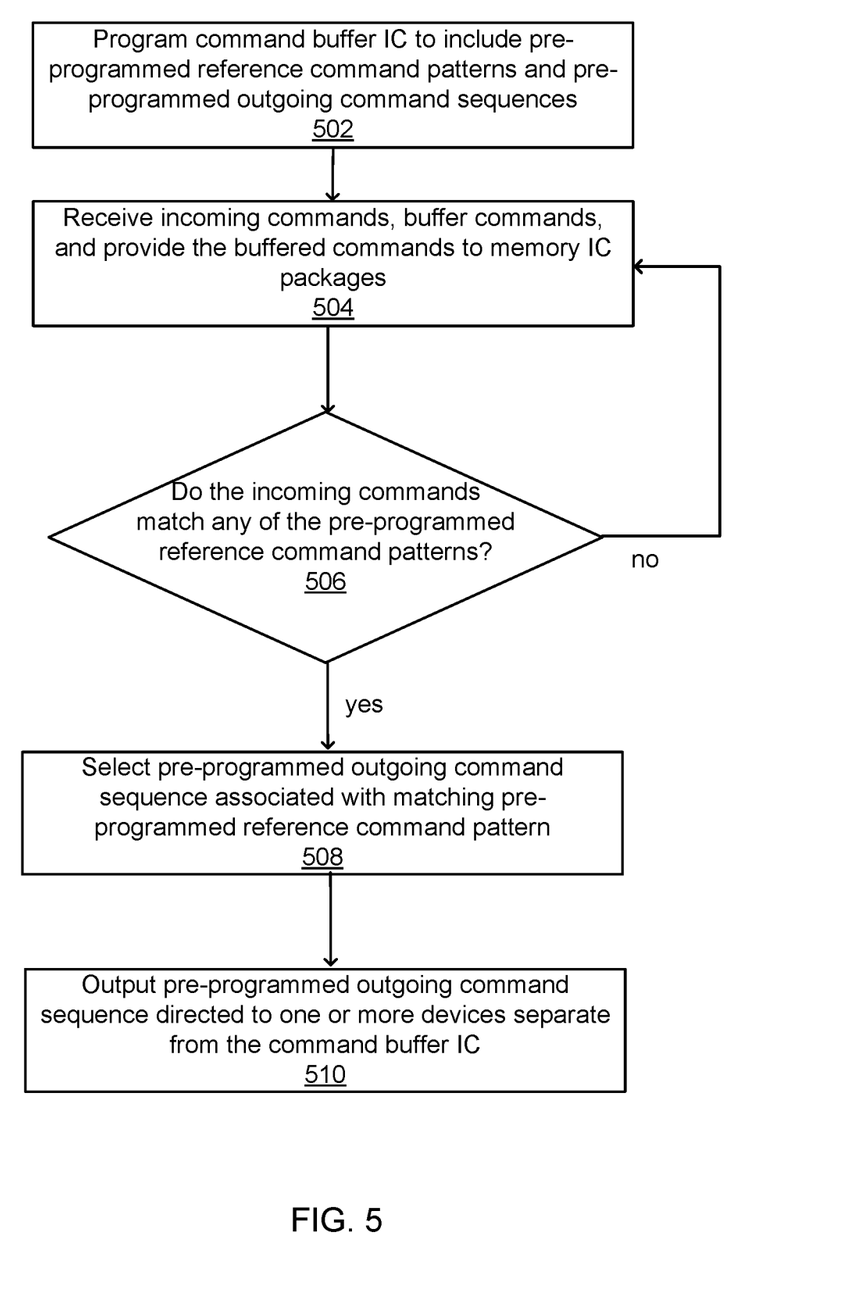
FIG. 5 is flowchart illustrating a method of operation in the memory system, according to at least one embodiment.

FIG. 5 is flowchart illustrating a method of operation in the memory system 5, according to an embodiment. In step 502, the command buffer IC 210 is programmed to include pre-programmed reference command patterns and pre-programmed outgoing command sequences. As an example, the programming may occur when the memory system 5 is first powered on. The programming by initiated by the memory controller 30 which transmits, to the command buffer IC 210, programming information such as a special program command and other information describing the reference command patterns and outgoing command sequences. The command buffer IC 210 completes the programming by storing the reference command patterns and their outgoing command sequences in response to the programming information.

In step 504, an interface circuit of the command buffer IC 210 receives incoming memory commands destined for the memory IC packages 10. The memory commands are buffered by the command buffer IC 210 and provided to the memory IC packages 10. These incoming memory commands are also stored in the command queue 365.

In step 506, the command buffer IC 210 determines whether the incoming commands match any of the pre-programmed reference command patterns. If there is no match, the command buffer IC 210 continues receiving incoming commands, buffering the commands, and providing the buffered commands to the memory IC packages 10. If there is a match, in step 508, the command buffer IC 210 selects the pre-programmed outgoing command sequence associated with matching pre-programmed reference command pattern.

In step 510, one or more interface circuits of the command buffer IC 210 output the pre-programmed outgoing command sequence to one or more devices separate from and external to the command buffer IC 210.

Figure 6:
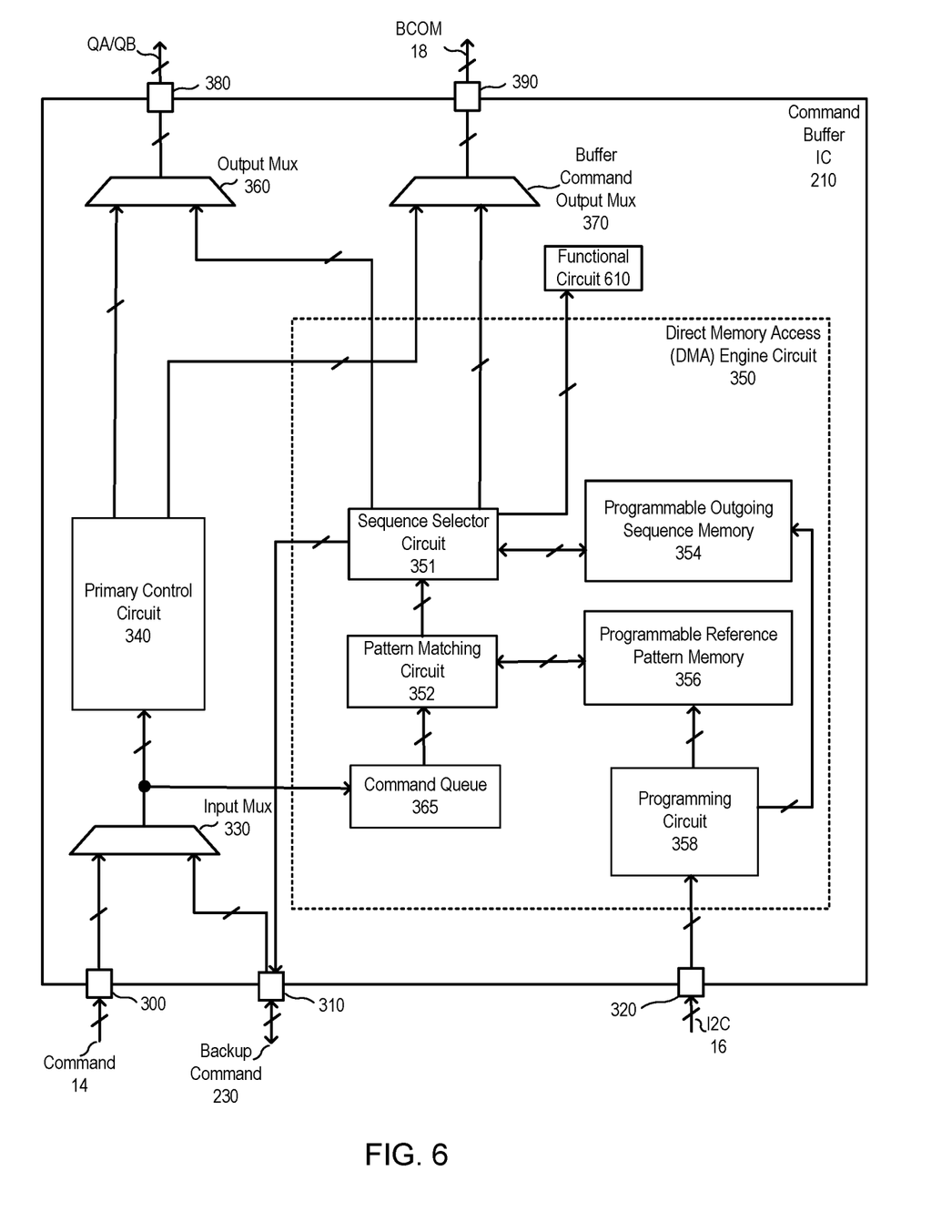
FIG. 6 is a more detailed view of a command buffer IC from FIG. 2, according to at least one embodiment.

FIG. 6 is a more detailed view of a command buffer IC from FIG. 2, according to an embodiment. The command buffer IC 210 of FIG. 6 is similar to the command buffer IC 210 of FIG. 2, but now includes an additional functional circuit 610 internal to the command buffer IC 210. The internal functional circuit 610 has a function that is controlled by one or more internal commands triggered responsive to the incoming commands matching a pre-programmed reference command pattern. In one embodiment, the functional circuit 610 causes the interface circuit 300 to disconnect the primary command channel 14 for a few seconds such that commands from the primary command channel 14 are ignored. In another embodiment, the functional circuit 610 causes an incoming clock signal to be ignored by the command buffer IC 210 for a few seconds.

Example Use Cases

In at least one embodiment of the present disclosure, the command buffer IC 210 can quickly send outgoing commands to memory IC packages 10, the NVM controller 250, and/or the data buffer ICs 202 whenever incoming commands to the command buffer IC match a pre-programmed incoming command pattern. Some example use cases are as follows.

First, the command buffer IC 210 is capable of quickly initiating actions to save data from the memory IC packages 10 the NVM data backup subsystem 240 in the event of a power failure. The command buffer IC 210 can snoop the incoming commands received from the primary command channel 14 for a specific pre-programmed pattern of commands representative of a power failure. In response, the command buffer IC 210 can disconnect itself from the primary command channel 14 and trigger a pre-programmed outgoing command sequence that is output to the memory IC packages 10, data buffer ICs 202, and/or the NVM controller 250 to begin the save routine. At least one of the commands output to the NVM controller 250 can include an interrupt command to trigger an interrupt with the NVM controller 250.

Second, bandwidth on the backup command channel 230 may be saved because the command buffer IC 210 will be capable of sending multiple commands autonomously. For example, a few commands received from the NVM controller 250 via the backup command channel 230 can trigger a large number of outgoing commands to the memory IC packages 10.

Third, the programmability allows for solutions to platform issues that may arise in the future. For example, if it is discovered that a particular memory controller 30 does not send the proper sequence of commands via the primary command channel 14, the command buffer IC 210 can be programmed to detect this improper sequence and then override the commands with a pre-programmed sequence of outgoing commands.

Fourth, during idle periods, the command buffer IC 210 can move data between the memory IC packages 10 and the NVM data backup subsystem 240. For example, the command buffer IC 210 can be pre-programmed to detect an illegal command sequence, and to use this sequence to trigger an outgoing sequence of commands to the IC memory packages 10 that causes data to be copied from the memory IC packages 10 to the NVM data backup subsystem 240.

In one embodiment, a representation of components described herein may be stored as data in a non-transitory computer-readable medium (e.g. hard disk drive, flash drive, optical drive). These representations may in the form of, for example, behavioral level descriptions, register transfer level descriptions, logic component level descriptions, transistor level descriptions or layout geometry-level descriptions.

Upon reading this disclosure, those of skill in the art may appreciate still additional alternative designs for a memory module and memory system. Thus, while particular embodiments and applications of the present disclosure have been illustrated and described, it is to be understood that the disclosure is not limited to the precise construction and components disclosed herein. Various modifications, changes and variations which may be apparent to those skilled in the art may be made in the arrangement, operation and details of the method and apparatus of the present disclosure herein without departing from the spirit and scope of the disclosure as defined in the appended claims.

What is claimed is:

1. A memory module comprising:
a plurality of memory integrated circuit (IC) packages to store data; and
a command buffer IC to buffer a plurality of memory commands destined for the memory IC packages, the command buffer IC comprising:
a memory to store a set of pre-programmed reference command patterns each comprising a sequence of commands, each of the set of pre-programmed reference command patterns associated in the memory with one of a set of pre-programmed command sequences;
a first interface circuit to receive the plurality of memory commands; and
a pattern matching circuit to identify from the memory, a matching pre-programmed reference command pattern corresponding to the plurality of memory commands;
a sequence selector circuit to select a corresponding pre-programmed command sequence from the memory that is associated with the matching pre-programmed reference command pattern; and
one or more second interface circuits to output the corresponding pre-programmed command sequence to one or more devices separate from the command buffer IC.

2. The memory module of claim 1, wherein the command buffer IC comprises:
a programming circuit to program the memory with the set of pre-programmed reference command patterns and the set of pre-programmed command sequences in response to information received by the command buffer IC.

3. The memory module of claim 1, wherein the pre-programmed command sequence output by the one or more second interface circuits comprises at least one command for the plurality of memory IC packages.

4. The memory module of claim 1, wherein the pre-programmed command sequence output by the one or more second interface circuits comprises at least one command for a non-volatile memory (NVM) controller circuit.

5. The memory module of claim 4, wherein the at least one command for the NVM controller comprises an interrupt command.

6. The memory module of claim 1, further comprising:
a plurality of data buffer ICs to buffer data transfers with the memory IC packages;
wherein the pre-programmed command sequence output by the one or more second interface circuits comprises at least one command for the data buffer ICs.

7. The memory module of claim 1, wherein the first interface circuit is for coupling to a primary command channel, the first interface circuit to receive the plurality of memory commands from a memory controller via the primary command.

8. The memory module of claim 1, wherein the first interface circuit is for coupling to a backup command channel, the first interface circuit to receive the plurality of memory commands from a non-volatile memory (NVM) controller via the backup command channel.

9. The memory module of claim 1, wherein the pre-programmed command sequence causes data to be copied from the memory IC packages to non-volatile memory.

10. The memory module of claim 1, wherein the command buffer IC comprises an internal functional circuit having a function that is controlled by one or more internal commands triggered responsive to the plurality of memory commands matching the pre-programmed reference command pattern.

11. A method of operation in system that comprises a memory module, the memory module comprising a command buffer integrated circuit ("IC") and a plurality of memory IC packages to store data, the method comprising:
  storing, by a memory, a set of pre-programmed reference command patterns each comprising a sequence of commands, each of the set of pre-programmed reference command patterns associated in the memory with one of a set of pre-programmed command sequences;
  buffering, by the command buffer IC, a plurality of memory commands destined for the memory IC packages;
  determining, by the command buffer IC, a matching pre-programmed reference command pattern from the memory corresponding to the plurality of memory commands;
  selecting a corresponding pre-programmed command sequence from the memory that is associated with the matching pre-programmed reference command pattern; and
  outputting the matching pre-programmed command sequence from the command buffer IC to one or more devices separate from the command buffer IC.

12. The method of claim 11, further comprising:
programming the command buffer IC to include the set of pre-programmed reference command patterns and the set of pre-programmed command sequences in response to information received by the command buffer IC.

13. The method of claim 11, wherein the pre-programmed command sequence comprises at least one command for the plurality of memory IC packages.

14. The method of claim 11, wherein the pre-programmed command sequence comprises at least one command for a non-volatile memory (NVM) controller.

15. The method of claim 11, wherein the memory module comprises a plurality of data buffer ICs to buffer data transfers with the memory IC packages;
  wherein the pre-programmed command sequence comprises at least one command for the data buffer ICs.

16. The method of claim 11 further comprising:
  receiving, at the command buffer IC, the plurality of memory commands from a memory controller via a primary command channel.

17. The method of claim 11 further comprising:
  receiving, at the command buffer IC, the plurality of memory commands from a non-volatile memory (NVM) controller via a backup command channel.

18. A memory module comprising:
a plurality of data storage means for storing data; and
a buffer means for buffering a plurality of memory commands destined for the plurality of data storage means, storing a set of pre-programmed reference command patterns each comprising a sequence of commands, each of the set of pre-programmed reference command patterns associated in the memory with one of a set of pre-programmed command sequences, determining a matching pre-programmed reference command pattern from the memory corresponding to the plurality of memory commands selecting a corresponding pre-programmed command sequence from the memory that is associated with the matching pre-programmed reference command pattern, and outputting the matching pre-programmed command sequence to one or more devices separate from the buffer means.

* * * * *